US007450456B2

(12) United States Patent
Jain et al.

(10) Patent No.: US 7,450,456 B2
(45) Date of Patent: Nov. 11, 2008

(54) TEMPERATURE DETERMINATION AND COMMUNICATION FOR MULTIPLE DEVICES OF A MEMORY MODULE

(75) Inventors: Sandeep Jain, Milpitas, CA (US); David Wyatt, San Jose, CA (US); Jun Shi, San Jose, CA (US); Animesh Mishra, Pleasanton, CA (US); John Halbert, Beaverton, OR (US); Melik Isbara, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/801,909

(22) Filed: May 10, 2007

(65) Prior Publication Data
US 2007/0211548 A1 Sep. 13, 2007

Related U.S. Application Data

(62) Division of application No. 11/093,905, filed on Mar. 30, 2005, now Pat. No. 7,260,007.

(51) Int. Cl.
*G11C 7/04* (2006.01)
*G11C 5/06* (2006.01)

(52) U.S. Cl. .................. 365/212; 365/211; 365/189.02; 365/189.07; 365/227; 365/228; 365/51; 365/63

(58) Field of Classification Search .................. 365/227, 365/228, 226, 212, 211, 51, 63, 189.02, 189.07
See application file for complete search history.

(56) References Cited

U.S. PATENT DOCUMENTS 5,875,085 A * 2/1999 Farley .......................... 361/18

| 6,008,685 | A | 12/1999 | Kunst |
| 6,021,076 | A | 2/2000 | Woo et al. |
| 6,373,768 | B2 * | 4/2002 | Woo et al. .................... 365/211 |
| 6,484,232 | B2 | 11/2002 | Olarig et al. |
| 6,809,914 | B2 | 10/2004 | Edmonds et al. |
| 7,260,007 | B2 * | 8/2007 | Jain et al. .................... 365/212 |
| 2003/0158696 | A1 | 8/2003 | Gold et al. |
| 2004/0199730 | A1 | 10/2004 | Eggers et al. |
| 2004/0260957 | A1 | 12/2004 | Jeddeloh et al. |
| 2005/0259496 | A1 | 11/2005 | Hsu et al. |
| 2008/0123305 | A1 * | 5/2008 | Amidi et al. ................. 361/737 |

OTHER PUBLICATIONS

PCT Search Report, PCT/US2006/012984, Filing date: Mar. 30, 2006, Applicant Intel Corporation.

* cited by examiner

*Primary Examiner*—Andrew Q Tran
(74) *Attorney, Agent, or Firm*—Blakely, Sokoloff, Taylor & Zafman LLP

(57) ABSTRACT

The temperature for multiple devices of a memory module are determined. In one example a memory module includes a printed circuit board, a plurality of memory chips on the printed circuit board, each chip containing a plurality of memory cells and a thermal sensor, and a multiplexer on the printed circuit board, independent of the memory chips, coupled to each of the thermal sensors. A current source is coupled to the multiplexer to provide a current to each one of the thermal sensors, and a voltage detector is coupled to the multiplexer to detect a voltage from each of the thermal sensors when a current is applied. A temperature circuit is coupled to the voltage detector to determine a temperature for each memory chip based on the detected voltage.

22 Claims, 5 Drawing Sheets

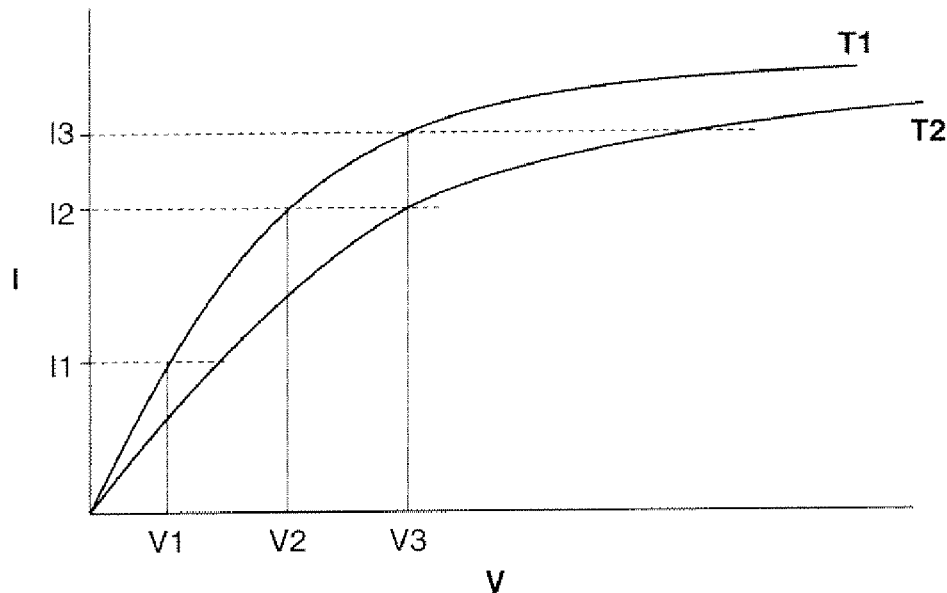
FIG. 3
FIG. 4
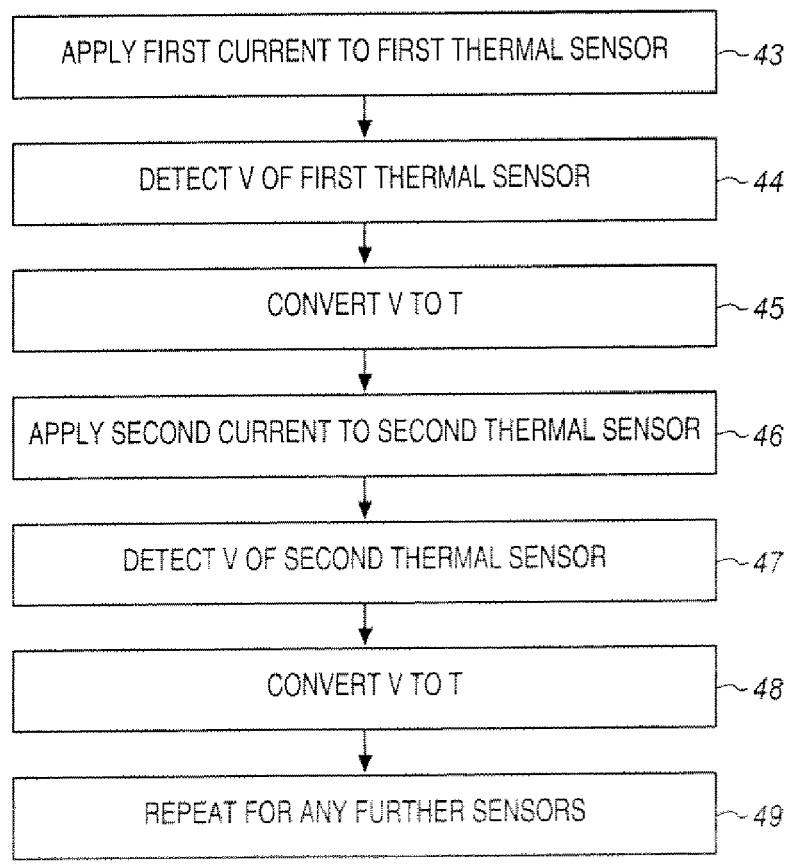

US 7,450,456 B2

TEMPERATURE DETERMINATION AND COMMUNICATION FOR MULTIPLE DEVICES OF A MEMORY MODULE

CROSS-REFERENCE TO RELATED APPLICATIONS

This application is a divisional application of U.S. patent application Ser. No. 11/093,905, entitled Temperature Determination and Communication for Multiple Devices of a Memory Module, filed Mar. 30, 2005, now U.S. Pat. No. 7,260,007, that has been allowed to issue, and priority is claimed thereof.

BACKGROUND

1. Technical Field

The present disclosure relates to thermal control in memory systems and, in particular, to determining and communicating operating temperatures of solid state memory devices.

2. Related Art

The temperature of a semiconductor memory, such as a RAM (random access memory) is largely determined by its activity level (rate of reads and writes into the memory cells) and its environment. If the temperature becomes too high, then the data stored in the memory may be corrupted or lost.

In addition, as the temperature of a solid state memory increases, the memory loses charge at a faster rate. If the memory loses charge, then it loses the data that was stored in its memory cells. RAM chips have self-refresh circuitry that restores the lost charge at periodic intervals. As the temperature increases the self-refresh rate must be increased in order to avoid losing the data. This increases power consumption.

In order to keep the refresh rates low and to avoid damage to the memory or loss of data, some information about the memory temperature must be known. The more accurate the temperature information, the hotter the memory may be permitted to run and the lower the refresh rate may be without risk of data loss. If the temperature information is not reliable or accurate, then the memory is run at a slower access rate and a faster refresh rate then necessary in order to provide some margin for error. Accurate temperature information may also be used to control cooling fans and other thermal controls.

Memory is often packaged in modules that contain several similar or identical IC (Integrated Circuit) chips, such as DRAM (Dynamic Random Access Memory) chips. The temperature of each chip may be different, depending on its level of use, available cooling and its own unique characteristics. Other devices on the memory module may have different temperatures as well. In order to accurately monitor all aspects of such a memory module, expensive thermal circuitry is required for each DRAM chip and maybe even for different portions of each DRAM chip. In addition, a communication system is required to transfer all of the temperature information to a device that can interpret the information and cause some action to be taken, if necessary. This additional circuitry may significantly increase the cost of the memory module.

BRIEF DESCRIPTION OF THE DRAWINGS

The various advantages of the embodiments of the present invention will become apparent to one skilled in the art by reading the following specification and appended claims, and by referencing the following drawings, in which:

FIG. 3 is a graph of a thermal diode's voltage response to an applied current;

FIG. 4 is process flow diagram of measuring the temperature of memory devices according to an embodiment of the invention;

DETAILED DESCRIPTION

Figure 1:
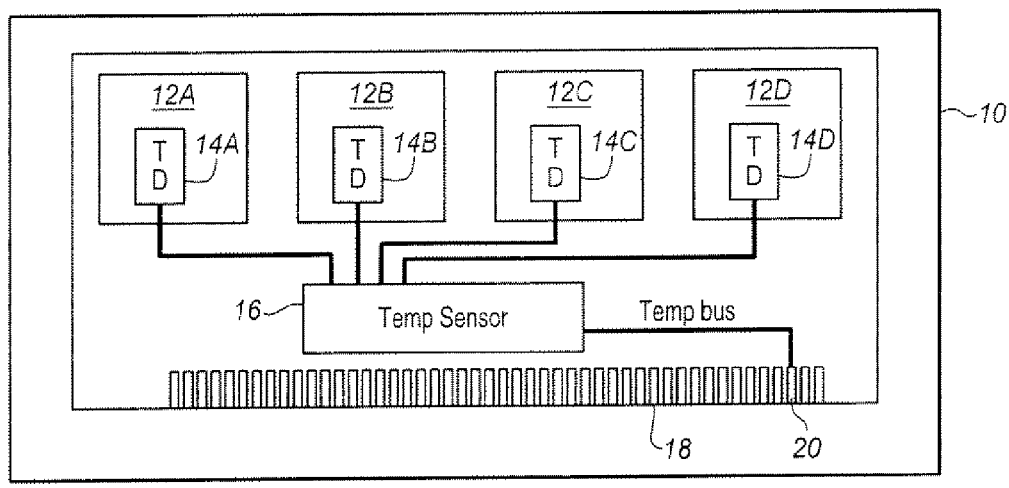
FIG. 1 is a block diagram of a memory module according to an embodiment of the invention.

FIG. 1 shows an example of a memory module that can provide accurate temperature information about as many of its components as desired. The memory unit 10 may be a standard or SO-DIMM (small outline dual inline memory module) of the type typically used in notebook personal computers (PCs). The DIMM 10 has an electrical contact connector 18 that may have a 240-pin, 144-pin, or 72-pin configuration that supports 64-bit transfers, or any other of a wide variety of different pin configurations for different transfer rates that correspond to a DIMM (Dual In-line Memory Module) structure or any other structure. The memory unit 10 may alternatively be a micro DIMM, or a full-size DIMM, more commonly used in desktop PCs.

In FIG. 1, the memory module 10 has a set of individual memory chips 12A, 12B, 12C, 12D, such as DRAM chips, of which only four are shown. More or fewer may be used depending on the embodiment. Each DRAM device contains millions of memory cells that may be addressed through a memory bus (not shown). The memory bus is couple to external components, such as a memory controller or processor through a multiple contact connector 18. During normal operation of the system, each DRAM device on the module may have a different temperature and the temperatures may change at different rates over time. The temperature differences may depend on several factors such as air flow in the system, position of the device, thermal constant of the device, the layout of the module, etc.

To track the temperature of each memory device 12, each memory device contains one or more thermal sensors, such as a thermal diode, that produces a particular voltage depending on its temperature and the current that is applied to it. In the example of FIG. 1, one thermal diode 14A, 14B, 14C, 14D is placed on each of the four DRAM devices. However, more diodes may be placed in each device to sense temperatures in different locations, to provide an averaged value, or to provide more detailed information.

Alternatively, fewer thermal sensors may be used, so that only some of the devices or those devices in hotter locations have thermal sensors. Thermal diodes may also be placed in other temperature critical components such as buffers on RDIMMs (Registered DIMM) and FBD (Fully Buffered DIMM) or in repeater devices or PLLs (Phase Locked Loop) used in memory subsystems. The thermal diodes all have terminals that are connected to the pins of each of the DRAM devices. These pins allow a drive current to be supplied to each diode and the corresponding voltage to be measured.

The module also contains a remote temperature sensor coupled to each of the thermal diode terminals. The remote temperature sensor may be placed anywhere on the module based on system and layout constraints or any other considerations. For example, the remote temperature sensor may be placed in the center of the memory module or in a well known hot spot based on knowledge of the module or its operating environment. The remote temperature sensor may be placed, for example in a SPD (Serial Presence Detect) device and configured to share the SPD device's resources on the module. The remote temperature sensor is further coupled to the contacts 18 of the memory module for power and communications. It may share those resources with the SPD, with other devices, or it may use dedicated resources including a dedicated communication link or bus.

As an alternative, the remote temperature sensor may be placed on a separate module. For example in a computer system that supports more than one module coupled to a motherboard, the remote temperature sensor may be moved to the motherboard. From the motherboard, the remote temperature sensor may measure the temperature of a large number of memory devices and memory subsystem components. Centralized thermal management may reduce the costs of each memory module. In order to allow the centralized thermal management system to operate a variety of different types of memory modules, each memory module may be supplied with a memory, such as an EEPROM that contains information about the thermal parameters of the memory module, such as thermal resistance, thermal time constants, current/voltage curves for the thermal diodes, and the number and placement of thermal diodes.

In one example, the remote temperature sensor is coupled to an I2C (inter integrated circuit) bus 20 (e.g., I2C Specification, Version 2.1, Phillips Semiconductors, January 2000), which can physically consist of two active wires and a ground connection. The active wires, termed serial data line (SDA) and serial clock line (SCL) are both bidirectional.

The remote temperature sensor may alternatively operate under an SMBus framework 20 (e.g., SMBus Specification, Version 2.0, SBS Implementers Forum, August 2000). An SMBus interface uses I2C as its backbone, and enables components to pass messages back and forth rather than tripping individual control lines. Such an approach is particularly useful for a system memory in a personal computer architecture.

Figure 2:
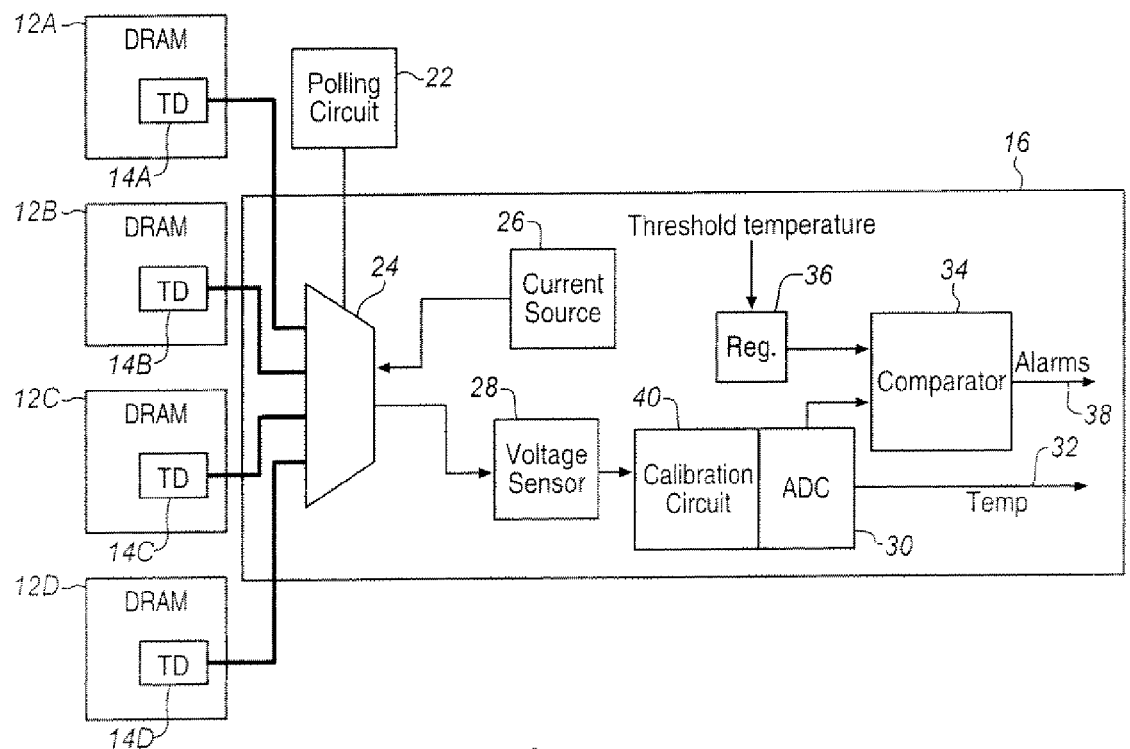
FIG. 2 is a block diagram of the remote temperature sensor of FIG. 1.

Referring to FIG. 2, the remote temperature sensor includes thermal sensor and control logic residing inside the SPD device or in some other location. The thermal sensor logic may be sitting in a stand-alone temperature sensor or in some other available device such as a buffer or PLL device. The connection pins on the thermal diodes are all coupled to a multiplexer 24 which switches between the different thermal sensors on command. A periodic polling circuit 22 generates a select signal to the connected multiplexer 24 to read the temperature voltages from the thermal diodes.

When a thermal diode is selected, a current is sent to the thermal diode from an ideal current source 26 through the multiplexer. Depending on the temperature of the associated device, a voltage across the diode bandgap may be sensed by a voltage sensor 28. The sensed voltage is fed to an ADC (Analog to Digital converter) 30 to convert data to a digital format that can be transmitted to the rest of the system. Alternatively, a lookup table may be used to determine a digital temperature. The digital temperature value may be supplied on a temperature pin out 32 for use by other circuitry.

The digital temperature may also be fed to a comparator 34 to be compared to one or more thresholds stored in an appropriate register 36. Based on the comparison, alarms may be generated 38. These may be used to indicate an over temperature condition, or any of a variety of other temperature related conditions as appropriate to the application.

Before the comparator 34, the temperature may be processed by a calibration circuit 40. A variety of different calibration approaches may be applied. In one embodiment, the remote temperature sensor 16 contains the critical thermal characteristics of the DRAM devices 12 and of the temperature diodes 14. This information may include thermal coefficients, thermal resistances, current/voltage curves of the thermal diodes, calibration information etc. This information is used to increase the accuracy of the temperature readings for each device.

To obtain a more accurate voltage reading, two or more different current levels I1, I2 may be applied to one or more of the thermal diodes. The different current levels may be injected into a diode one at a time and spaced apart by an interval of a few nanoseconds and two or more corresponding different voltages V1, V2 may be captured and sampled in the ADC. The different currents provide two or more additional data points for the temperature reading. The readings can be applied to a current/voltage curve specific to a particular diode temperature, such as the curves shown in FIG. 3. The curves may be used to eliminate calibration errors. The data points can be averaged to eliminate spurious spikes in voltage readings that may result in false alarms. The number of data points can be increased to increase accuracy further.

Referring to FIG. 3 in more detail, it shows a graph of current on the vertical axis against voltage on the horizontal axis. There are two curves labeled T1 and T2 which represent a characteristic behavior of a thermal sensor such as a thermal diode. At a first temperature, T1, a thermal sensor will produce the T1 curve. The T1 curve shows that driven by a current of I1, the diode will produce a voltage of V1. Driven by a current of I2, the diode will produce a voltage of V2, and driven by a current of I3, the diode will produce a voltage of V3. If the temperature changes then the corresponding voltages also change as shown by the T2 curve.

By applying these three voltages to the thermal sensor, three measured voltages can be obtained. The voltages are compared to various curves stored, for example, in a lookup table. Plotting the three points against the curve allows for a more accurate determination of the temperature. By scaling the curve, any offsets in the system can be compensated.

The curve T2 is shown as an example of how the thermal sensor at temperature T2 will produce different voltages at the same three input currents and that the curve will have a different shape. By matching the voltage readings to the right shape, the current can be accurately determined even when the readings are all off by some amount. These curves may be stored in the calibration circuit 40 and applied in order to provide a more accurate temperature determination.

FIG. 4 shows a process that may be applied to the hardware configuration of FIGS. 1 and 2 to determine temperatures and generate alarms or reports. In FIG. 4, the temperature of a large number of memory devices, such as SDRAMS may be polled sequentially using, for example, a multiplexer. At block 43, a first current is applied to a first thermal sensor. As mentioned above, the thermal sensor may be embedded within a first memory device such as an SDRAM or any other thermally sensitive device. Such a device may be a part of a memory module that contains several memory devices. The current may be applied for example by switching the multiplexer, to the first thermal sensor and then driving the current source through the multiplexer to the first thermal sensor.

At block 44, the voltage at the first thermal sensor is detected. This voltage may be detected through the multiplexer that is coupled to the thermal sensor right after the current is applied. The voltage may then be converted into a temperature value at block 45 that is indicative of the temperature of the first memory device. This may be done through thresholding, through an ADC or in any of a variety of other ways. As mentioned above the temperature may also be determined by applying several different currents to the thermal sensor and then comparing each of the voltages to a curve.

A similar process is next applied to the next thermal sensor. At block 46 current is applied to a second thermal sensor which may be associated with the same or another memory device. The same current source may be used to apply the current to a different thermal sensor by switching the multiplexer to connect to the second thermal sensor. The current may be same as the first current or it may be a different current. At block 47, the resulting voltage is detected and at block 48, the voltage is converted into a temperature related signal. The application of currents and measuring of temperatures may be applied to all of the remaining thermal sensors at block 49 in any desired order sequentially. In one embodiment, the thermal sensors are assigned an ordering and each thermal sensor is connected to the multiplexer one after the other. After a temperature has been obtained from each thermal sensor, the cycle repeats to obtain temperatures from each of the others. When an over temperature or other event is detected, then this can be communicated to a thermal manager, a memory manager or some other device. The device may be a part of the memory module or external.

Figure 5:
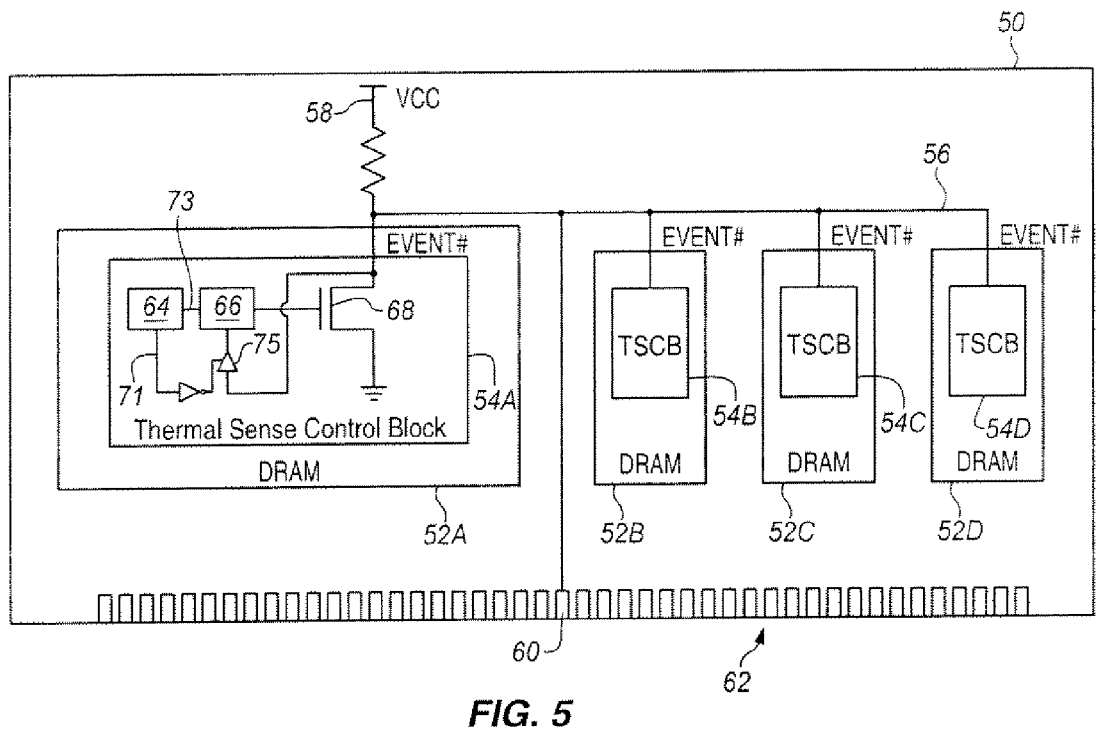
FIG. 5 is a block diagram of a memory module according to another embodiment of the invention.

FIG. 5 shows an alternative memory module configuration. In the example of FIG. 5, as in FIG. 1, a memory module 50 has multiple memory devices 52A, 52B, 52C, 52D such as SDRAM chips. While four chips are shown, more or fewer chips may be used. Each of the individual memory devices of FIG. 5 include a thermal sense control block (TSCB) 54A, 54B, 54C, 54D that is coupled to the same open drain signal 56 (EVENT#). The open drain signal connects the power well at VCC 58 through an impedance to a contact 60 on the memory module's electrical multiple contact connector 62. The connector may have a variety of different form factors, as mentioned above with respect to FIG. 1 and may have 240, 172, or some other number of contacts or pins.

The TCSB of each memory device may have the same design. In the example of FIG. 5, the TCSBs are each identical in construction and share access to the same open drain line 56 which serves as a communications bus. In FIG. 5, the TCSB 54A of one of the memory device's 52A is shown in more detail. The block includes a thermal sensor 64 coupled to a logic block 66. The thermal sensor may take a variety of different forms, including a diode. The logic block may include a current source for the diode and a voltage detector that senses the voltage across the diode when a current is applied to it. The logic block may include various calibration, offset and calibration circuits to convert the voltage to a reliable temperature value.

In one embodiment, the temperature value in the thermal sensor is compared to one or more thresholds and, if appropriate, an event signal 71, 73 is generated. The event signal is applied to the logic block and to a three state enable buffer 75. In one embodiment, the thermal sensor applies a thermal voltage, related to the temperature to the logic block and a binary high or low signal to the buffer. The logic block uses the thermal voltage to determine a temperature. In another embodiment, the signal applied to the logic block is the same as the signal applied to the buffer.

Depending on the state of the enable buffer, the logic block drives an event gate 68 that applies an open drain to the event line 56. The thermal sensor may use an analog voltage comparator to compare the diode voltage to an analog threshold and generate an event. As another alternative, any of the logic approaches described above with respect to FIGS. 1 and 2 may be employed in the thermal sensor or the logic block.

The three state enable buffer is an example a configuration that may be used to allow the EVENT# bus may be shared among multiple memory chips or multiple memory devices. The three state enable bus receives the event signal from the thermal sensor on one input. On its other input, it receives the EVENT# line. If the EVENT# line is high, then the enable buffer sends a disable to the logic block. This means that another device is using the line. If the EVENT# line is low and the thermal sensor input is low, then the enable buffer also sends a disable to the logic block. This means that the EVENT# line is not being used but there is no event at the thermal sensor. If the EVENT# line is low and the thermal sensor input is high, then the enable buffer sends an enable to the logic block. This allows the logic block to set an event on the EVENT# line which is otherwise not occupied.

The enable buffer allows the single line to be shared by any number of thermal sense control blocks. In some applications, it will not matter which memory device is allowed to access the EVENT# line first because the same thermal correction measure will be applied if any one of the memory devices overheats. In some applications it will not matter which memory device obtains access to the EVENT# line first because temperatures and alerts may be communicated quickly enough that all memory devices may have time to report. The enable buffer is provided as one example of allowing multiple devices to communicate on a single serial bus. Any of a variety of simpler or more complex sharing and arbitration schemes may be used. These may include established complex serial bus protocols.

The single pin interface of the logic block to the EVENT# line may also be used to send thermal events information to an external memory controller. Using the single pin interface, thermal information that is collected by each logic block for each memory device or DRAM may be communicated to the external system. This may allow the system to identify the hottest DRAM on a memory module and determine its temperature or its thermal condition.

The external memory controller may be used to program threshold temperature values in all the logic blocks in all of the connected memory modules. The threshold may be the same temperature value for each memory device, however, different thresholds may be used for each device. Alternatively each memory module or each memory device may contain its own threshold information. In another embodiment, each memory module has a read-only memory that contains temperature thresholds. This information is read by the memory controller and then the thresholds read from the read-only memory are written into the logic blocks of each memory device.

When any of the memory devices determines that a thermal event has occurred, for example, due to a temperature passing a threshold, then the corresponding logic block may pull the EVENT# pin low to indicate to the external memory controller that a threshold has been reached. As mentioned above, using an enable buffer or any other arbitration scheme, pulling the EVENT# pin low may be made conditional on the EVENT# pin being unused. In one embodiment, the EVENT# signal acts as an interrupt to notify the memory controller, and the memory controller responds by requesting information about the event. The EVENT# line may then be used as a single serial interface to communicate temperature information to the memory controller.

In a computing system with multiple ranks of memories or with multiple memory channels or multiple memory modules, the EVENT# line may be used to communicate periodic information about memory temperature and status at regular intervals. The memory controller or system software may use the temperature information to determine rates of temperature changes. This may allow it to better monitor and control system thermals. In applications in which only the hottest DRAM is of interest, the shared EVENT# signal may be used as an interruptible bus for the hottest DRAM to interrupt and use to report.

Figure 6:
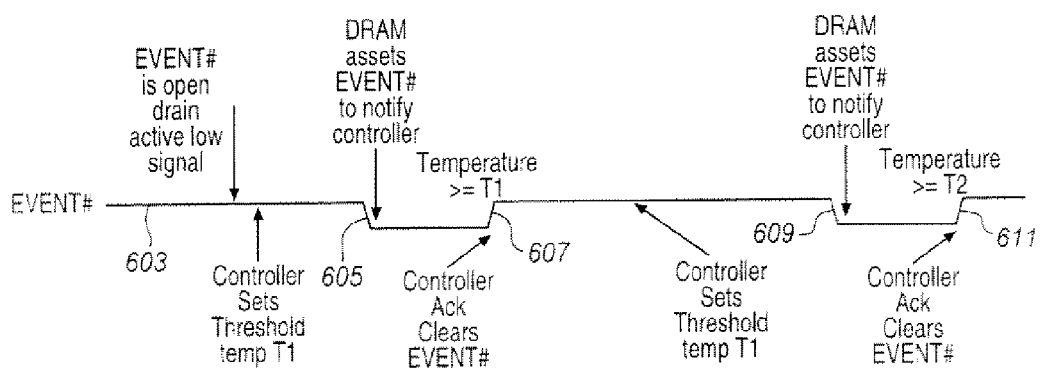
FIG. 6 is a timing diagram of signals asserted on an EVENT# line according to an embodiment of the invention.
Figure 7:
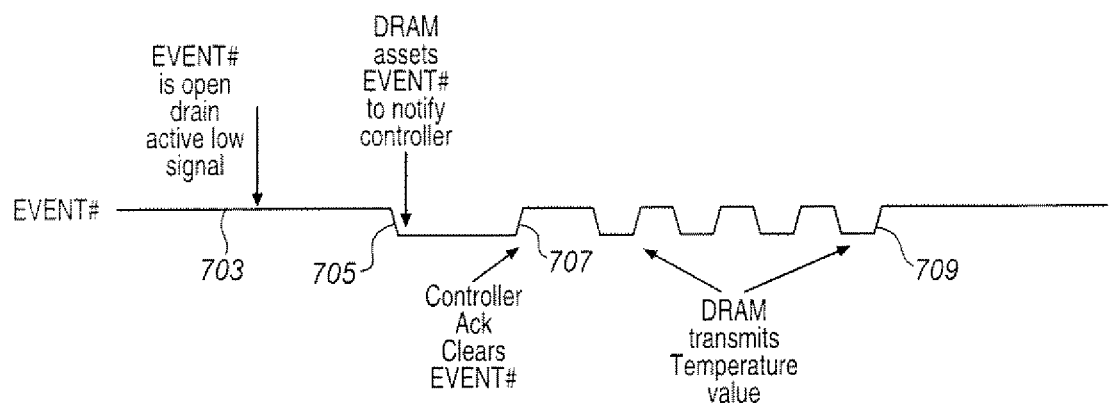
FIG. 7 is a timing diagram of signals asserted on an EVENT# line according to another embodiment of the invention.

The EVENT# line or any other communication line may be used to communicate in a variety of different ways. A few examples are presented in the context of FIGS. 6 and 7. FIGS. 6 and 7 show voltages asserted on the EVENT# line over time. In FIG. 6, the memory controller controls thresholds used by a memory chip logic block. In FIG. 7, the logic block provides serial temperature data in response to requests from the controller.

Referring to FIG. 6, at the beginning 603 of the time line on the far left, the EVENT# line is set to an open drain and the signal is an active low. The memory controller has set a first temperature threshold in the logic block or the thermal sensor. This may be done based on any of the approaches mentioned above, or the initial temperature threshold may be preprogrammed into the logic block. The thresholds may be communicated using a separate control or memory bus, or the thresholds may be programmed by using the EVENT# line as a serial bus.

At a later time 605 on the time line, one of the logic blocks 66 asserts the EVENT# line, signaling the controller that there is a thermal event, or in other words, that the temperature of a thermal diode has exceeded the threshold temperature. The controller then acknowledges the event to the logic block and the event is cleared at a later time point 607. In one embodiment, the controller then reprograms the threshold temperature value as soon as the EVENT# is detected or cleared. Again, this may be on a separate control bus, or it may be done using the EVENT# line (not shown).

The two thresholds may be used so that initially the controller programs a low temperature threshold value T1. Once T1 is reached the logic block notifies the controller by asserting EVENT#. In response, the controller clears the event bit inside the DRAM logic block, and the DRAM logic block takes off or desserts the EVENT#. The memory controller then programs a higher temperature value T2. Once the memory reaches T2, the logic block again alerts the controller that T2 has been reached 609. The controller again clears the register 611. The controller may then program another temperature threshold or take some corrective or compensating action.

In certain circumstances, the temperature of a memory device may exceed the first threshold and then start falling. In this case, the higher threshold will not be crossed and the memory controller will not obtain thermal information about the memory device for some time. In order to continue to receive useful information about the memory device, a timer or time-out may be used. After receiving the first event at T1 and resetting the threshold to T2, the controller may set a timer. If T2 is not reached before the timer expires, then the controller may reset the threshold back to T1. This allows the memory controller to check whether the memory device is still above the first threshold T1. If an event is received, then the second, higher threshold may be plugged back in.

The embodiment of FIG. 7 starts 703 in a state similar to that of FIG. 6 with the active low signal and the logic block or the thermal sensor holding the initial threshold in memory. Similarly, once the sensed temperature exceeds the first threshold, the logic block asserts an event 705. The controller, upon receiving the event may acknowledge it and clear the event bit inside the logic block 707. The logic block may then transmit its temperature data serially using the EVENT# line 709.

The configuration of the serial temperature value may be adapted to suit any implementation. The number of bits, the amount of redundancy and the need for an acknowledgment may all be set to accommodate the needs of any particular application. A variety of different predefined bit patterns or code words may be used to send particular values. In the example of FIG. 7, a 4 bit data word is transmitted on the EVENT# line to the controller. The serial data transmission may be based on any of a variety of different clocks. In one embodiment, the memory device or DRAM clock may be used as the base reference clock. A slower reference clock may be used to save power or reduce errors.

As mentioned above, the EVENT# line may be an open drain signal, shared between all the logic blocks of all the memory devices on the memory module. When using the EVENT# lines as a thermal bus, one of the logic blocks may assert exclusive control over the bus. This may prevent other logic blocks from driving the EVENT# line during a transmission. In one embodiment, a logic block acquires exclusive control because all of the logic blocks monitor the EVENT# internally. If one logic block triggers the EVENT# signal to the controller, the other logic blocks will detect the trigger and avoid use of the line for some time interval or until the temperature value transmission is over.

Figure 8:
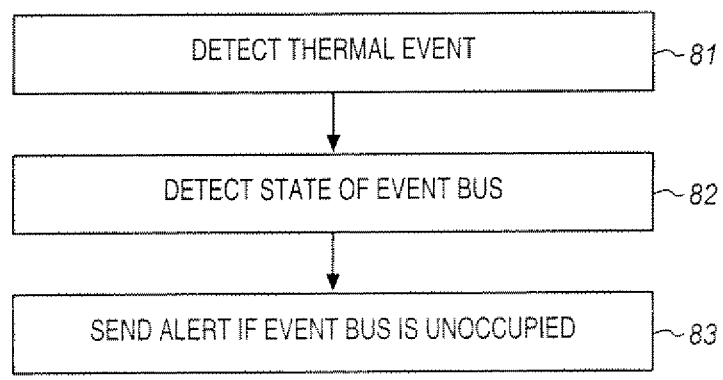
FIG. 8 is a process flow diagram of communicating temperature information across a memory module's serial bus according to an embodiment of the invention.

FIG. 8 shows a process that may be within the thermal sense control block of FIG. 5 in accordance with one embodiment of the invention. As shown in FIG. 8, at block 81 a thermal event is detected. This may be done by the thermal sensor, by the logic block or through coordinated action. In the illustrated embodiment, the event is detected at the enable buffer.

At block 82, the state of the connected event bus is detected. This may correspond to the EVENT# line of FIG. 5 or any other bus that may be used to communicate events to another device. The event bus may be coupled to an external device such as a thermal or memory controller or it may be coupled to a device on the memory module. In the example of FIG. 5, the event bus state is detected by the enable buffer.

At block 83, an alert is sent on the event bus if the event bus is in an unoccupied state. The alert may be sent by pulling a pin to a particular state or by sending another type of signal. If the event bus is occupied, then the alert may wait until the state of the event bus changes. As mentioned above, after an alert is sent, temperature information such as threshold data or temperature numbers may also be sent on the event bus, depending on the particular implementation. Alternatively, the event bus may be used only to send alerts.

Figure 9:
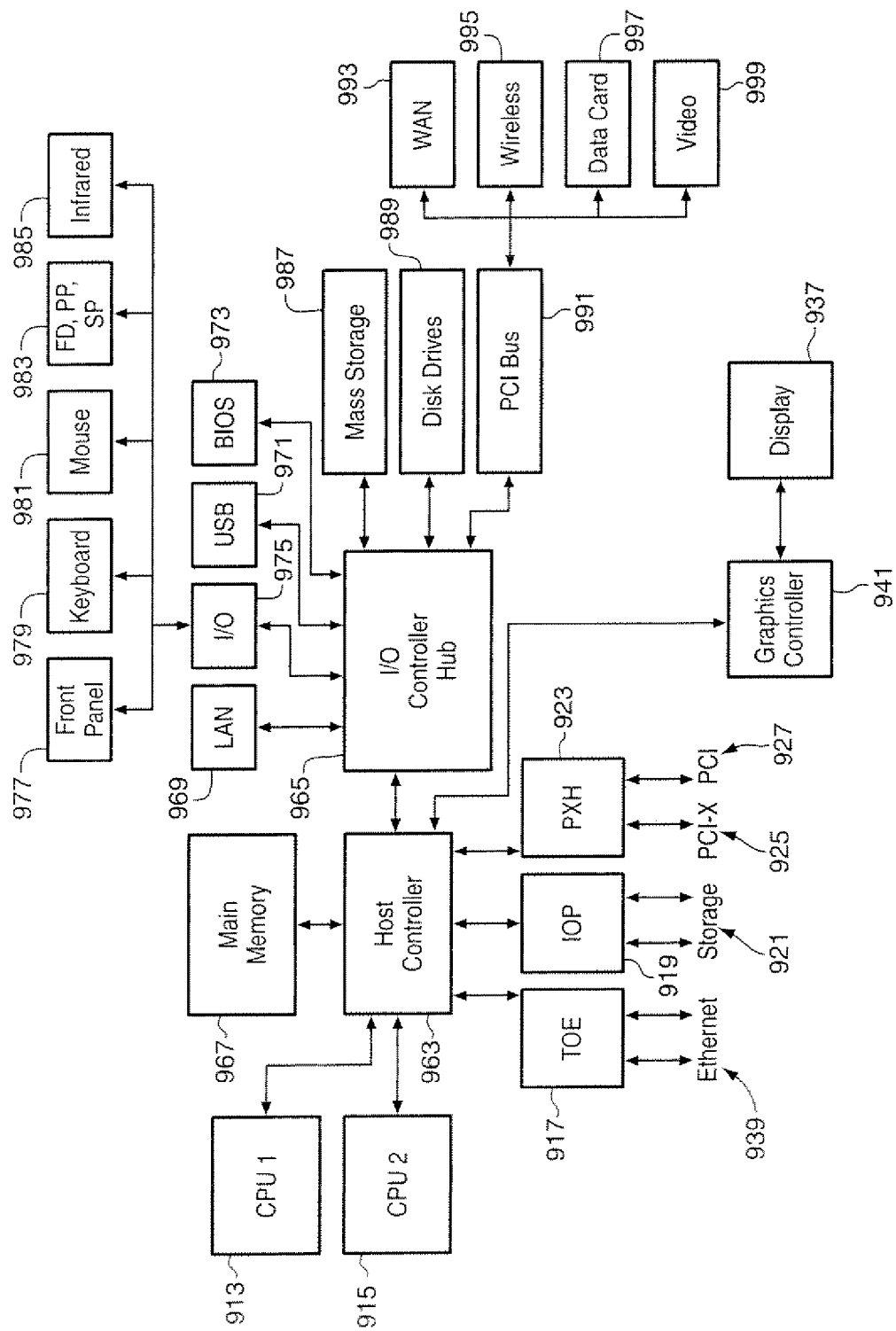
FIG. 9 is a block diagram of a computer system suitable for implementing embodiments of the present invention.

FIG. 9 shows an example of a computer system that may be used in applications of some embodiments of the invention. In the example system of FIG. 9, the MCH 911 has a pair of FSBs (front side bus) each coupled to a CPU or processor core 913, 915. More or less than two processor cores and FSBs may be used. Any number of different CPUs and chipsets may be used. The north bridge receives and fulfills read, write and fetch instructions from the processor cores over the FSBs. The north bridge also has an interface to system memory 967, such as DIMMs (Dual In-line Memory Modules) similar to those shown in FIGS. 1 and 5, in which instructions and data may be stored, and an interface to an ICH (input/output controller hub) 965.

The MCH may have a system memory bus over which commands and data may be sent to and fetched from the memory modules. The commands may include temperature thresholds and temperature read commands. The MCH may also have an event bus, or other thermal bus, such as I2C or SMBus to communicate with the memory modules independently of the system memory bus. The MCH may include a thermal management system for the memory modules that applies thermal measures in response to memory information from the memory modules. The thermal measures may include adjusting traffic rates and refresh rates as well as operating fans or other cooling devices.

The MCH also has an interface, such as a PCI (peripheral component interconnect) Express, or AGP (accelerated graphics port) interface to couple with a graphics controller 941 which, in turn provides graphics and possible audio to a display 937. The PCI Express interface may also be used to couple to other high speed devices. In the example of FIG. 9, six x4 PCI Express lanes are shown. Two lanes connect to a TCP/IP (Transmission Control Protocol/Internet Protocol) Offload Engine 917 which may connect to network or TCP/IP devices such as a Gigabit Ethernet controller 939. Two lanes connect to an I/O Processor node 919 which can support storage devices 921 using SCSI (Small Computer System Interface), RAID (Redundant Array of Independent Disks) or other interfaces. Two more lanes connect to a PCI translator hub 923 which may support interfaces to connect PCI-X 925 and PCI 927 devices. The PCI Express interface may support more or fewer devices than are shown here. In addition, while PCI Express and AGP are described, the MCH may be adapted to support other protocols and interfaces instead of, or in addition to those described.

The ICH 965 offers possible connectivity to a wide range of different devices. Well-established conventions and protocols may be used for these connections. The connections may include a LAN (Local Area Network) port 969, a USB hub 971, and a local BIOS (Basic Input/Output System) flash memory 973. A SIO (Super Input/Output) port 975 may provide connectivity for a front panel 977 with buttons and a display, a keyboard 979, a mouse 981, and infrared devices 985, such as IR blasters or remote control sensors. The IO port may also support floppy disk, parallel port, and serial port connections. Alternatively, any one or more of these devices may be supported from a USB, PCI or any other type of bus or interconnect.

The ICH may also provide an IDE (Integrated Device Electronics) bus or SATA (serial advanced technology attachment) bus for connections to disk drives 987, 989 or other large memory devices. The mass storage may include hard disk drives and optical drives. So, for example, software programs, parameters or user data, may be stored on a hard disk drive or other drive. A PCI (Peripheral Component Interconnect) bus 991 is coupled to the ICH and allows a wide range of devices and ports to be coupled to the ICH. The examples in FIG. 9 include a WAN (Wide Area Network) port 993, a Wireless port 995, a data card connector 997, and a video adapter card 999. There are many more devices available for connection to a PCI port and many more possible functions. The PCI devices may allow for connections to local equipment, or nearby computers. They may also allow for connection to various peripherals, such as printers, scanners, recorders, displays and more. They may also allow for wired or wireless connections to more remote equipment or any of a number of different interfaces.

The particular nature of any attached devices may be adapted to the intended use of the device. Any one or more of the devices, buses, or interconnects may be eliminated from this system and other may be added. For example, video may be provided on the PCI bus, on an AGP bus, through the PCI Express bus or through an integrated graphics portion of the host controller.

As shown in FIG. 9, the ICH is coupled to the MCH and also to a CPU (Central Processing Unit) 36 which sends data to and fetches data from the system memory 10. In the illustrated embodiment, the system memory sends and receives memory data to and from the MCH and the MCH controls the memory's refresh rate. The ICH communicates stored data from the system memory to other devices (not shown). Any one or more of these three devices may be consolidated into a single unit. The MCH may be incorporated into the CPU or the ICH and the functions of all three devices may be combined into a single chip. The ICH may be used to perform thermal management and control functions, or a separate thermal management device (not shown) may be used to receive temperature information directly or indirectly and apply thermal measures based on this information.

It is to be appreciated that a lesser or more equipped memory unit, memory module, thermal sensor, thermal management, or computer system than the examples described above may be preferred for certain implementations. Therefore, the configuration of the examples provided above may vary from implementation to implementation depending upon numerous factors, such as price constraints, performance requirements, technological improvements, or other circumstances. Embodiments of the present invention may also be adapted to other types of memory systems and to other thermal environments than the examples described herein. The particular types of standby and power modes described herein may also be adapted to suit different applications.

Embodiments of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other types of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A memory module comprising:
 a printed circuit board;
 a plurality of memory chips on the printed circuit board, each chip containing a plurality of memory cells and a thermal sensor;
 a multiplexer on the printed circuit board, independent of the memory chips, coupled to each of the thermal sensors;
 a current source coupled to the multiplexer to provide a current to each one of the thermal sensors;
 a voltage detector coupled to the multiplexer to detect a voltage from each of the thermal sensors when a current is applied; and
 a temperature circuit coupled to the voltage detector to determine a temperature for each memory chip based on the detected voltage.

2. The memory module of claim 1, wherein the current source provides a plurality of different currents to each thermal sensor and the voltage detector detects a plurality of different voltages from each thermal sensor, each different voltage corresponding to a different current.

3. The memory module of claim 2, wherein the temperature circuit combines the different detected voltages from each thermal sensor to determine a temperature for each memory chip.

4. The memory module of claim 3, wherein the temperature circuit applies the different detected voltages to current/voltage curves for each thermal sensor to determine a temperature for each memory chip.

5. The memory module of claim 1, further comprising a comparator to compare the determined temperatures to thresholds and generate an alarm if the temperature for any one of the plurality of memory chips is too high.

6. The memory module of claim 1, further comprising a polling circuit on the printed circuit board coupled to the multiplexer to switch the multiplexer between the plurality of thermal sensors so that a current is applied to each thermal sensor in sequence and independently of the others.

7. The memory module of claim 1, further comprising a communications bus coupled to the temperature circuit to allow the temperature circuit to send the determined temperatures to external chips.

8. The memory module of claim 7, wherein the communications bus is an SMBus.

9. A memory module comprising:
 a printed circuit board;
 a plurality of memory chips on the printed circuit board, each chip containing a plurality of memory cells and a thermal sensor;
 a current source on the printed circuit board independent of the memory chips coupled to the thermal sensors to apply a current to each of the thermal sensors sequentially;
 a voltage detector independent of the memory chips coupled to each of the thermal sensors to detect a voltage from each of the thermal sensors when a current is applied;
 a temperature circuit coupled to the voltage detector to determine a temperature for each memory chip based on the detected voltage; and
 a memory controller independent of the memory chips coupled to receive the determined temperatures and apply a thermal measure based thereon.

10. The memory module of claim 9 further comprising a bus to connect the memory controller to the temperature circuit and wherein the temperature circuit sends the determined temperatures to the memory controller using the bus.

11. The memory module of claim 9, further comprising a comparator to compare the determined temperatures to thresholds and to send an alarm to the memory controller if the temperature for any one of the plurality of memory chips exceeds a threshold.

12. An apparatus comprising:
 a plurality of memory devices, each device containing a plurality of memory cells and a thermal sensor;
 a multiplexer coupled to each of the thermal sensors;
 a current source coupled to the multiplexer to provide a current to the thermal sensors;
 a voltage detector coupled to detect a voltage from each of the thermal sensors when a current is applied; and
 a temperature circuit coupled to determine a temperature for each memory device based on the detected voltage.

13. The apparatus of claim 12, wherein the current source provides a plurality of different currents to each thermal sensor and the voltage detector detects a plurality of different voltages from each thermal sensor, each different voltage corresponding to a different current.

14. The apparatus of claim 13, wherein the temperature circuit combines the different detected voltages from each thermal sensor to determine a temperature for each memory device.

15. The apparatus of claim 14, wherein the temperature circuit applies the different detected voltages to current/voltage curves for each thermal sensor to determine a temperature for each memory device.

16. The apparatus of claim 12, further comprising a comparator to compare the determined temperatures to thresholds and generate an alarm if the temperature for any one of the plurality of memory devices is too high.

17. The apparatus of claim 12, further comprising a polling circuit coupled to the multiplexer to switch the multiplexer between the plurality of thermal sensors so that a current is applied to each thermal sensor in sequence and independently of the others.

18. The apparatus of claim 12, further comprising a communications bus coupled to the temperature circuit to allow the temperature circuit to send the determined temperatures to external devices.

19. The apparatus of claim 18, wherein the communications bus is an SMBus.

20. An apparatus comprising:
 a plurality of memory devices, each device containing a plurality of memory cells and a thermal sensor;
 a current source coupled to the thermal sensors to apply a current to each of the thermal sensor sequentially;
 a voltage detector coupled to each of the thermal sensors to detect a voltage from each of the thermal sensors when a current is applied;
 a temperature circuit coupled to determine a temperature for each memory device based on the detected voltage; and
 a memory controller coupled to receive the determined temperatures and apply a thermal measure based thereon.

21. The apparatus of claim 20, further comprising a bus to connect the memory controller to the temperature circuit and wherein the temperature circuit sends the determined temperatures to the memory controller using the bus.

22. The apparatus of claim 20, further comprising a comparator to compare the determined temperatures to thresholds and to send an alarm to the memory controller if the temperature for any one of the plurality of memory devices exceeds a threshold.

* * * * *